United States Patent [19]
Graeme et al.

[11] Patent Number: 5,907,262
[45] Date of Patent: *May 25, 1999

[54] FOLDED-CASCODE AMPLIFIER STAGE

[75] Inventors: Jerald G. Graeme, Tucson, Ariz.; Madhav V. Kolluri, Sunnyvale, Calif.

[73] Assignees: Maxim Integrated Products, Inc., Sunnyvale, Calif.; Gain Technology Corporation, Tucson, Ariz.

[ * ] Notice: This patent issued on a continued prosecution application filed under 37 CFR 1.53(d), and is subject to the twenty year patent term provisions of 35 U.S.C. 154(a)(2).

[21] Appl. No.: 08/751,605

[22] Filed: Nov. 18, 1996

[51] Int. Cl.$^6$ ...................................................... H03F 3/26
[52] U.S. Cl. .......................... 330/255; 330/257; 330/265
[58] Field of Search ..................................... 330/255, 257, 330/263, 265, 267

[56] References Cited

U.S. PATENT DOCUMENTS

| | | | |
|---|---|---|---|
| 4,284,958 | 8/1981 | Pryor et al. ............................... | 330/253 |
| 4,313,082 | 1/1982 | Neidorff ............................... | 330/267 X |
| 4,587,495 | 5/1986 | Osawa et al. ............................ | 330/311 |
| 4,797,631 | 1/1989 | Hsu et al. ............................... | 330/253 |
| 4,814,723 | 3/1989 | Botti .................................. | 330/267 X |
| 4,935,704 | 6/1990 | Gross .................................. | 330/267 X |
| 5,019,789 | 5/1991 | Graeme et al. ...................... | 330/274 X |
| 5,374,897 | 12/1994 | Moraveji ............................. | 330/255 X |
| 5,384,549 | 1/1995 | Araki ........................................ | 330/298 |
| 5,399,991 | 3/1995 | Moraveji ................................ | 330/255 |
| 5,402,433 | 3/1995 | Stiscia . | |
| 5,420,540 | 5/1995 | Butler ..................................... | 330/252 |
| 5,471,172 | 11/1995 | Chiu et al. ............................... | 330/253 |
| 5,473,623 | 12/1995 | Fahey et al. . | |
| 5,512,859 | 4/1996 | Moraveji ................................. | 330/267 |

OTHER PUBLICATIONS

"Precision Rail–to–Rail Input & Output Operational Amplifier", (OP284/OP484), Analog Devices, Inc., 1995.

"Voltage Feedback Amplifier", Bipolar Circuits and Technology Meeting 9.1, p. 145, IEEE, 1993.

Technical Manual, "Single +5V, Fully Integrated, 1.2Gbps Laser Diode Driver," (MAX3261) Maxim Integrated Products, Inc., 1995.

*Primary Examiner*—Steven J. Mottola
*Attorney, Agent, or Firm*—Hickman Stephens & Coleman, LLP

[57] ABSTRACT

An amplifier circuit that offers high bandwidth operation and a high slew rate is disclosed. The amplifier circuit may also have an input voltage swing down to the negative rail which is particularly suitable for low voltage applications having a single power source. In one embodiment, the amplifier circuit amplifies a difference voltage between first and second input voltages to produce an output voltage, and includes: an analog voltage-to-current converter for receiving the first and second input voltages and producing complementary current signals; and a complementary mirror output stage coupled to receive the complementary current signals at respective mirror circuits. Each of the respective mirror circuits includes a pair of base-coupled transistors having their emitters respectively connected to supply potentials through resistors, and the complementary current signals from the analog voltage-to-current converter are respectively connected to at least one of the emitter of the base-coupled transistors for the respective mirror circuits.

21 Claims, 6 Drawing Sheets

5,907,262

FOLDED-CASCODE AMPLIFIER STAGE

BACKGROUND OF THE INVENTION

1. Field of the Invention

The present invention relates to analog circuits, and more particularly, to stages for amplifier circuits.

2. Description of the Related Art

Amplifiers are commonly known and used in discrete analog circuits and in monolithic integrated circuits (ICs). For details on amplifier fundamentals, see e.g., Malvino, *Electronic Principles*, McGraw-Hill, Inc., 1973. Often amplifiers will consist of a number of stages. These stages may, for example, include an input stage followed by one or more amplifying stages. The last stage is referred to as an output stage. One function served by an input stage is to provide an appropriate input impedance. The input stage may also provide some amplification. Usually, the amplifying stages (including the output stage) provide most of the needed amplification.

FIG. 1 is a schematic diagram of a conventional amplifier 100. The conventional amplifier 100 has a differential input stage 102 followed by a folded cascode stage 104. The differential input stage 102 is a differential amplifier constructed from a current source $I_1$ and transistors $Q_1$ and $Q_2$. The folded cascode stage 104 is constructed from cascode transistors $Q_3$ and $Q_4$, load transistors $Q_5$ and $Q_6$, and emitter resisters $R_{E1}$ and $R_{E2}$. The conventional amplifier 100 also includes an output voltage $V_{OUT}$, an output capacitor $C_C$, and a bias voltage source $V_B$. The conventional amplifier 100 offers a high bandwidth and essentially a rail to rail voltage swing, both of which are advantageous. However, one problem with the conventional amplifier 100 is that the maximum rate-of-change, i.e., slew rate, for the output voltage $V_{OUT}$ is significantly limited. In effect, the current source I'operates to determine a maximum output current $i_o$ that leads to the slew rate limitation. This slew rate limitation is commonly present with amplifiers that employ differential stages such as that illustrated in FIG. 1.

One approach to overcome the slew rate limitation is to use a complementary design. FIG. 2 is a schematic diagram of a conventional amplifier 200. Although other complementary designs exists, the conventional amplifier 200 is at least useful to illustrate the improvement provided by a complementary design. The conventional amplifier 200 is constructed from a diamond follower input stage 202 and a complementary current mirror stage 204. The diamond follower input stage 202 is constructed from current sources $I_1$ and $I_2$ and transistors $Q_1$ through $Q_4$. The transistors $Q_3$ and $Q_4$ drive opposing current mirror circuits formed by transistors $Q_7$ and $Q_8$ and transistors $Q_5$ and $Q_6$, respectively. The maximum slew rate for the output voltage $V_{OUT}$ then depends on the amount of output current $i_o$ available to charge a compensation capacitor $C_C$. Here, however, unlike FIG. 1, the output current $i_o$ is not limited by the current sources $I_1$ and $I_2$ but instead offers (via the driving of transistors $Q_3$ and $Q_4$) the ability to provide a large and largely unlimited output current $i_o$. Consequently, the conventional amplifier 200 has a slew rate limit that far exceeds that available with the conventional amplifier 100 illustrated in FIG. 1.

Although the conventional amplifier 200 illustrated in FIG. 2 overcomes the slew rate problem, the conventional amplifier 200 is a non-cascode amplifier and as such the input voltage swing of the conventional amplifier 200 is restricted. The input voltage swing is restricted by two emitter-base voltage drops (i.e., $V_{be}(Q_2)$ and $V_{be}(Q_5)$) for negative going input signals) that separate the input voltage range from the power supply rails ($V_{CC}$ and $V_{EE}$), which in low power designs can be a substantial penalty.

Thus, there is a need for an amplifier design that offers not only high bandwidth operation but also a high slew rate and a wide input voltage swing.

SUMMARY OF THE INVENTION

Broadly speaking, the invention relates to an amplifier circuit that offers high bandwidth operation and a high slew rate. The amplifier circuit according to the invention may also have an input voltage swing down to the negative rail which is particularly suitable for low voltage applications having a single power source. The invention can be implemented in numerous ways. Several embodiments of the invention are discussed below.

As an amplifier for amplifying a difference voltage between first and second input voltages to produce an output voltage, one embodiment of the invention includes: an analog voltage-to-current converter for receiving the first and second input voltages and producing complementary current signals; and a complementary mirror output stage coupled to receive the complementary current signals at respective mirror circuits, wherein each of the respective mirror circuits includes a pair of base-coupled transistors having their emitters respectively connected to supply potentials through resistors, and wherein the complementary current signals from the analog voltage-to-current converter are respectively connected to at least one of the emitters of the base-coupled transistors for the respective mirror circuits.

As an amplifier for amplifying a difference voltage between first and second input voltages to produce an output voltage, another embodiment of the invention includes: a first buffer circuit for receiving the first and second input voltages and producing a first set of complementary current signals; and a current amplification circuit for receiving the first set of complementary current signals and outputting an output voltage, the output voltage being an amplified version of the difference of the first and second input voltages. The current amplification circuit includes complementary circuitry with first and second circuits. The first circuit includes: a first transistor having an emitter connected to a first potential through a first resistor, a collector connected to a second potential through a first bias current source, and a base connected to the collector, the emitter also being connected to receive a first of the first set of complementary current signals; and a second transistor having an emitter connected to the first potential through a second resistor, a collector connected to an output terminal from which the output voltage is obtained, and a base connected to the base of the first transistor. The second circuit includes: a third transistor having an emitter connected to the second potential through a third resistor, a collector connected to the first potential through a second bias current source, and a base being connected to the collector, the emitter also being connected to receive a second of the first set of complementary current signals; and a fourth transistor having an emitter connected to the second potential through a fourth resistor, a collector connected to the output terminal from which the output voltage is obtained, and a base being connected to the base of the third transistor. Preferably, the first buffer circuit is an input diamond follower circuit or class AB amplifier.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention relates to an amplifier circuit that offers high bandwidth operation and a high slew rate. The amplifier circuit according to the invention may also have an input voltage swing down to the negative rail which is particularly suitable for low voltage applications having a single power source. The invention can be implemented in numerous ways. Several embodiments of the invention are discussed below.

Embodiments of the invention are discussed below with reference to FIGS. 3–6. However, those skilled in the art will readily appreciate that the detailed description given herein with respect to these figures is for explanatory purposes as the invention extends beyond these limited embodiments.

Figure 1:
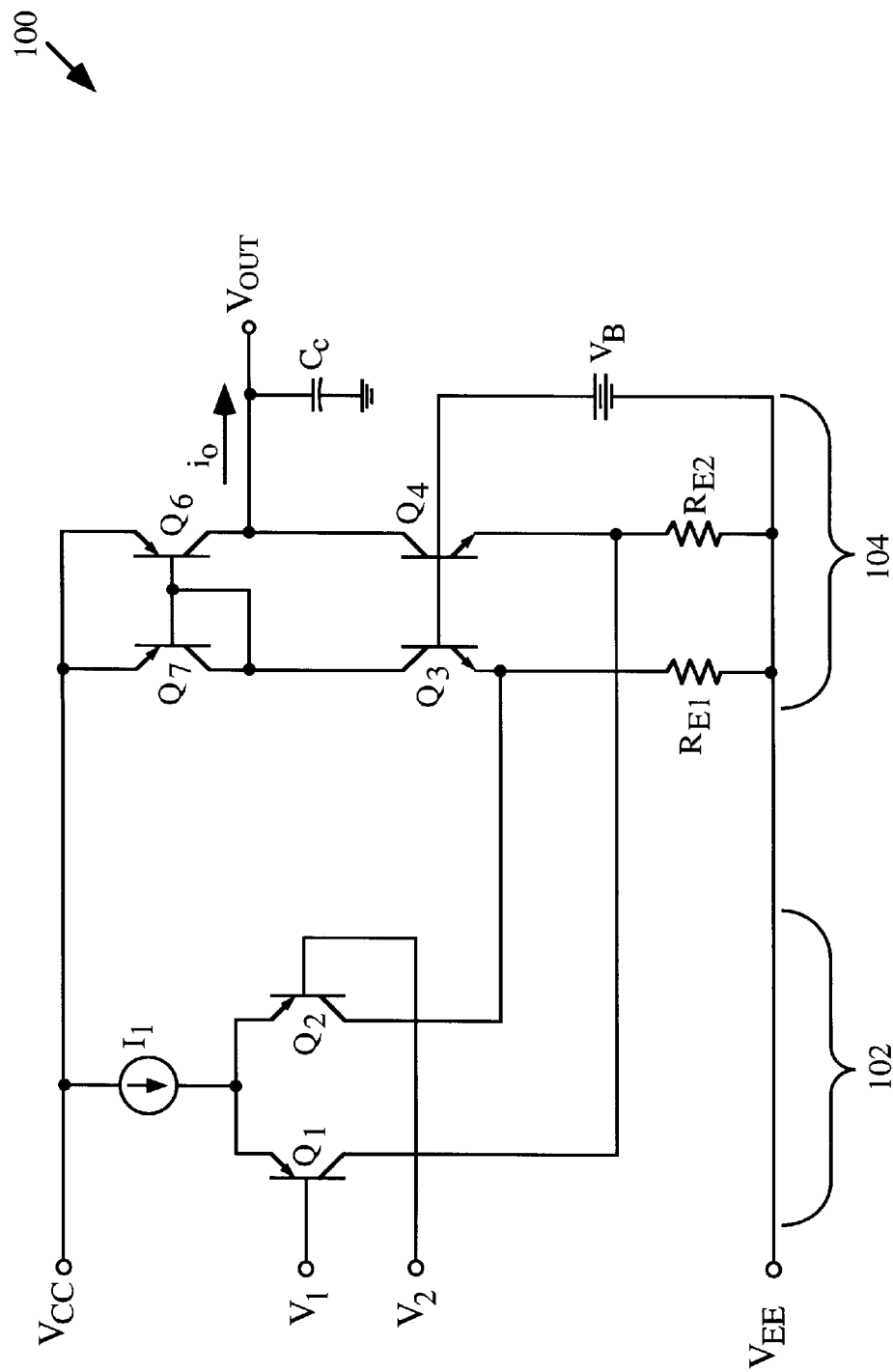
FIG. 1 is a schematic diagram of a conventional amplifier having a differential input stage followed by a folded cascode stage.
Figure 2:
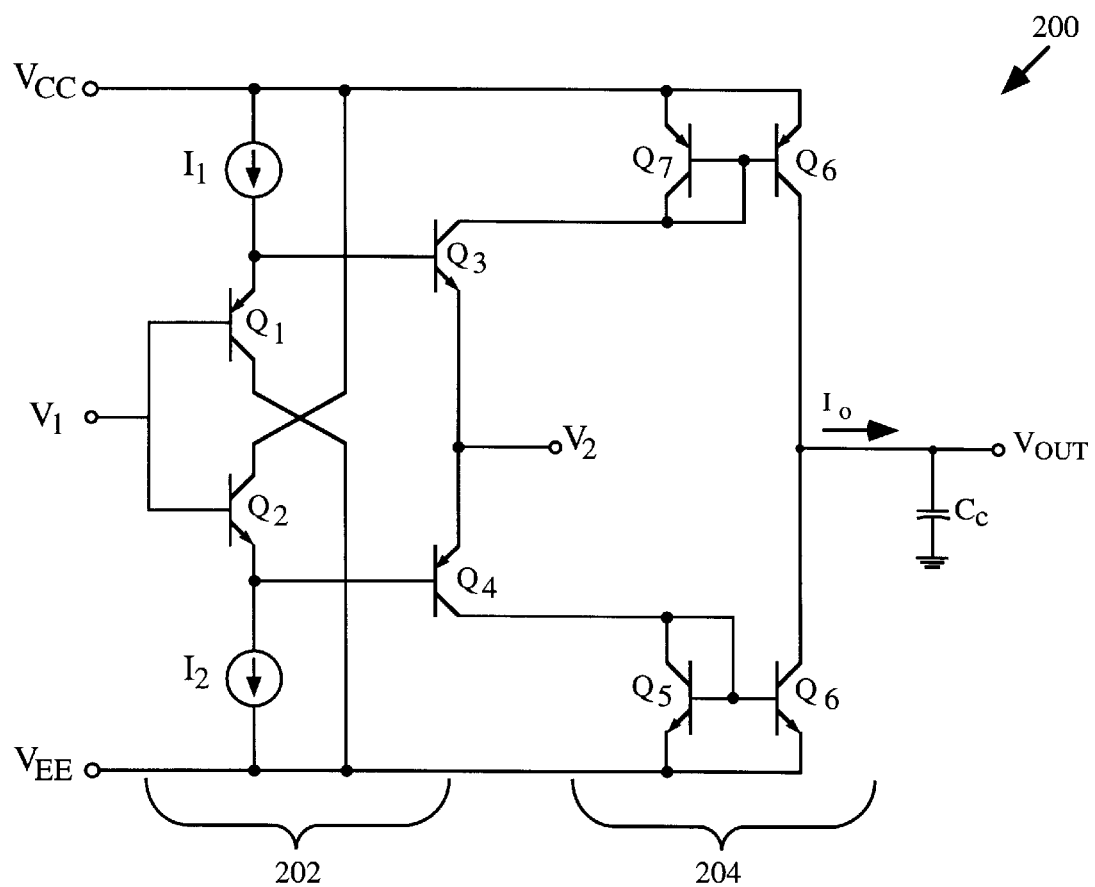
FIG. 2 is a schematic diagram of a conventional amplifier with a complementary design that includes a diamond follower input stage and a complementary current mirror stage.
Figure 3:
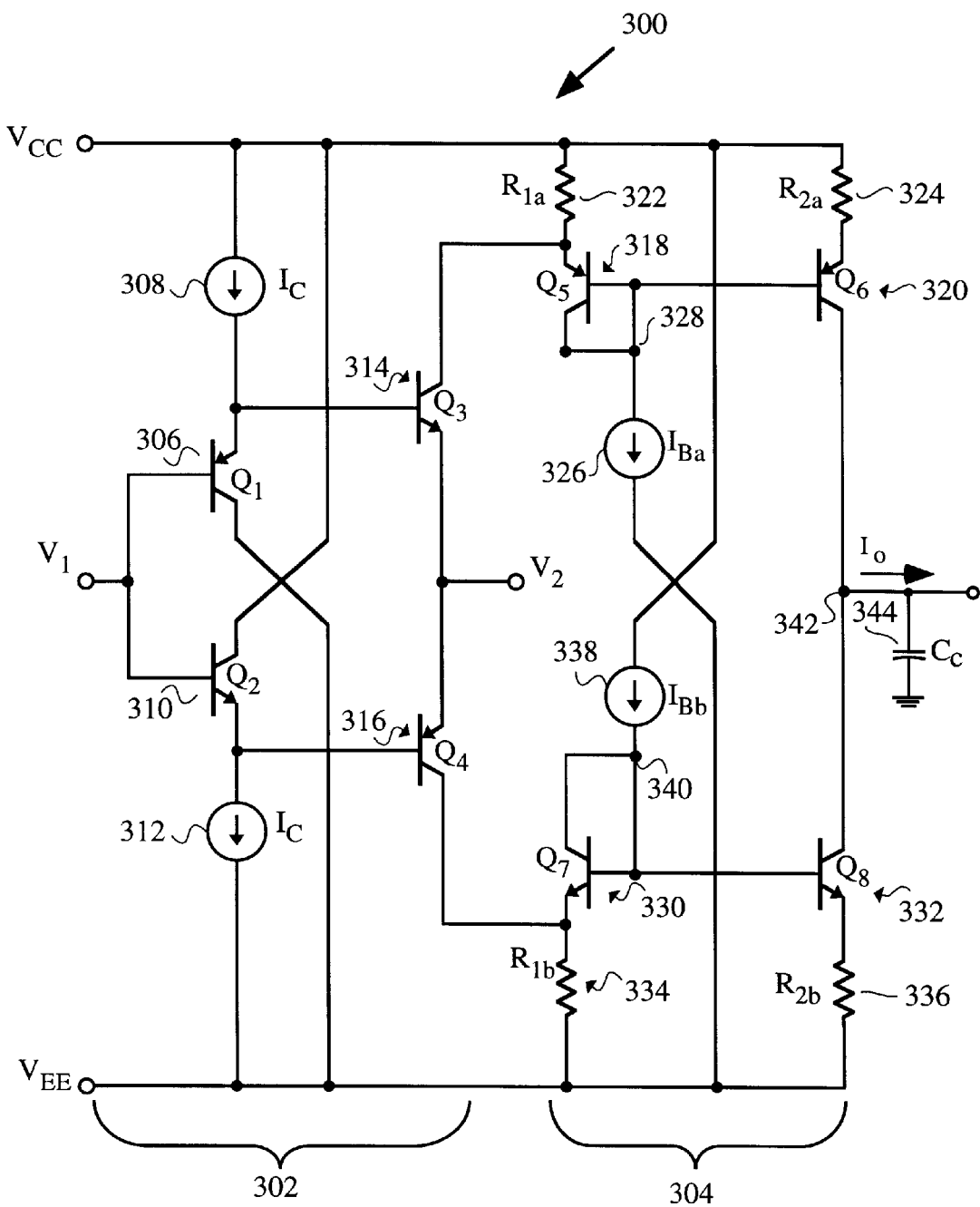
FIG. 3 is a schematic diagram of complementary output stage according a first embodiment of the invention.

FIG. 3 is a schematic diagram of an amplifier circuit 300 according to a first embodiment of the invention. In this embodiment, a differential input voltage ($V_1$–$V_2$) is amplified and output. The amplifier circuit 300 includes an input diamond follower circuit 302 and a complementary cascode circuit 304. The input diamond follower circuit 302 pertains to an input stage and the complementary cascode circuit 304 pertains to an output stage.

The input diamond follower circuit 302 receives the complementary input voltages $V_1$ and $V_2$ and supplies complementary current signals to the complementary cascode circuit 304. The complementary cascode circuit 304 receives the complementary current signals and then amplifies the complementary current signals to output an output voltage ($V_{OUT}$).

The input diamond follower circuit 302 includes a first transistor ($Q_1$) 306 and a second transistor ($Q_2$) 310. The base of the first transistor ($Q_1$) 306 receives the input voltage $V_1$, the emitter of the first transistor ($Q_1$) 306 is connected to a current source ($I_c$) 308 that is in turn connected to a positive power supply source ($V_{CC}$), and the collector of the first transistor 306 is connected to a negative power supply source ($V_{EE}$). The base of the second transistor ($Q_2$) 310 receives the input voltage $V_1$, the collector of the second transistor 310 is connected to the positive power supply source ($V_{CC}$), and the emitter of the second transistor ($Q_2$) 310 is connected to a current source ($I_c$) 312 that is in turn connected to the negative power supply source ($V_{EE}$).

The input diamond follower circuit 302 also includes a third transistor ($Q_3$) 314 and a fourth transistor ($Q_4$) 316. The input voltage $V_2$ is coupled to the commonly connected emitters of the third transistor ($Q_3$) 314 and the fourth transistor ($Q_4$) 316. The base of the third transistor 314 is connected to the emitter of the first transistor ($Q_1$) 306, and the base of the fourth transistor ($Q_4$) 316 is connected to the emitter of the second transistor ($Q_2$) 310. The input diamond follower circuit 302 provides two (complementary) outputs to the complementary cascode circuit 304. The first output is from the collector of the third transistor ($Q_3$) 314, and the second output is from the collector of the fourth transistor ($Q_4$) 316. In this embodiment, the first and fourth transistors ($Q_1$ and $Q_4$) 306 and 316 are PNP-type transistors, and the second and third transistors ($Q_2$ and $Q_3$) 310 and 314 are NPN-type transistors.

The complementary cascode circuit 304 is coupled to the input diamond follower circuit 302 to receive the two (complementary) outputs therefrom. Since the complementary cascode circuit 304 is a complementary design, the circuitry for the complementary portions are symmetrical.

One complementary portion of the complementary cascode circuit 304 includes a fifth transistor ($Q_5$) 318 and a sixth transistor ($Q_6$) 320. In this embodiment, the fifth and sixth transistors (($Q_5$) and ($Q_6$)) 318 and 320 are PNP-type transistors. The emitter of the fifth transistor ($Q_5$) 318 is connected to the positive power supply source ($V_{CC}$) via a first resistor ($R_{1a}$) 322. The emitter of the fifth transistor ($Q_5$) 318 also receives the first output signal from the third transistor ($Q_3$) 314 of the input diamond follower circuit 302. The bases of the fifth and sixth transistors (($Q_5$) and ($Q_6$)) 318 and 320 are connected together. The collector of the fifth transistor ($Q_5$) 318 is connected to the commonly connected bases of the fifth and sixth transistors (($Q_5$) and ($Q_6$)) 318 and 320. Also, the collector of the fifth transistor ($Q_5$) 318 is connected to a bias current source ($I_{Ba}$) 326. The bias current source ($I_{Ba}$) 326 is then in turn connected to the negative power supply source ($V_{EE}$). A connection of the base and the collector of the fifth transistor ($Q_5$) 318 with the bias current source ($I_{Ba}$) 326 occurs at a node 328. The emitter of the sixth transistor ($Q_6$) 320 is connected to the positive power supply source ($V_{CC}$) via a second resistor ($R_{2a}$) 324, and the collector of the sixth transistor ($Q_6$) 320 is connected to an output terminal that outputs an output voltage $V_{OUT}$.

The other complementary portion of the complementary cascode circuit 304 includes a seventh transistor ($Q_7$) 330 and an eighth transistor ($Q_8$) 332. In this embodiment, the seventh and eighth transistors (($Q_7$) and ($Q_8$)) 330 and 332 are NPN-type transistors. The emitter of the seventh transistor 330 is coupled to the negative power supply source ($V_{EE}$) via a first resistor ($R_{1b}$) 334. The emitter of the seventh transistor ($Q_7$) 330 receives the second output signal from the fourth transistor ($Q_4$) 316 of the input diamond follower circuit 302. The bases of the seventh and eighth transistors (($Q_7$) and ($Q_8$)) 330 and 332 are connected together. The collector of the seventh transistor ($Q_7$) 330 is connected to the commonly connected bases of the seventh and eighth transistors (($Q_7$) and ($Q_8$)) 330 and 332. Also, the collector of the seventh transistor ($Q_7$) 330 is connected to a bias current source ($I_{Bb}$) 338. The bias current source ($I_{Bb}$) 338 is then in turn connected to the positive power supply source ($V_{CC}$). A connection of the base and the collector of the seventh transistor ($Q_7$) 330 with the bias current source ($I_{Bb}$) 338 occurs at a node 340. The emitter of the eighth transistor ($Q_8$) 332 is connected to the negative power supply source ($V_{EE}$) via a second resistor ($R_{2b}$) 336, and the collector of the eighth transistor ($Q_8$) 332 is connected to the output terminal that outputs the output voltage $V_{OUT}$.

The output voltage ($V_{OUT}$) is obtained from a node 342 that connects together the collector of sixth transistor ($Q_6$) 320 and the eighth transistor ($Q_8$) 332. The node 342 is coupled to the output terminal and also to ground via a capacitor 344. In this embodiment, the fifth and sixth transistors ($Q_5$ and $Q_6$) 318 and 320 are PNP-type transistors, and the seventh and eighth transistors ($Q_7$ and $Q_8$) 330 and 332 are NPN-type transistors.

The amplifier circuit 300 has the advantage of high slew rate due to the input diamond follower circuit 302. In addition, the connection of the input diamond follower 302 with the complementary cascode circuit 304 enables the amplifier circuit 300 to also provide a respectable voltage swing. In particular, the voltage swing for the amplifier circuit 300 is approximately from $V_{CC}-V_{be}(Q_2)$ to $V_{EE}+V_{be}(Q_2)$, where $V_{CC}$ is the positive supply potential and $V_{EE}$ is the negative supply potential. As an example, with $V_{CC}$ equal to +3 Volts and $V_{EE}$ equal to −3 Volts, the voltage swing for the amplifier circuit 300 would be approximately from +2.3 to −2.3 Volts, assuming that the $V_{be}(Q_2)$ is approximately 0.7 Volts. The resistors ($R_{1a}$, $R_{1b}$, $R_{2a}$, $R_{2b}$) allow the complementary cascode circuit 304 to provide exponential drive current by the sixth transistor ($Q_6$) 320 and the eighth transistor ($Q_8$) 332, yet the voltage drops across the resistors ($R_{1a}$, $R_{1b}$, $R_{2a}$, $R_{2b}$) are small and have minimal impact on the available voltage swing.

Figure 4:
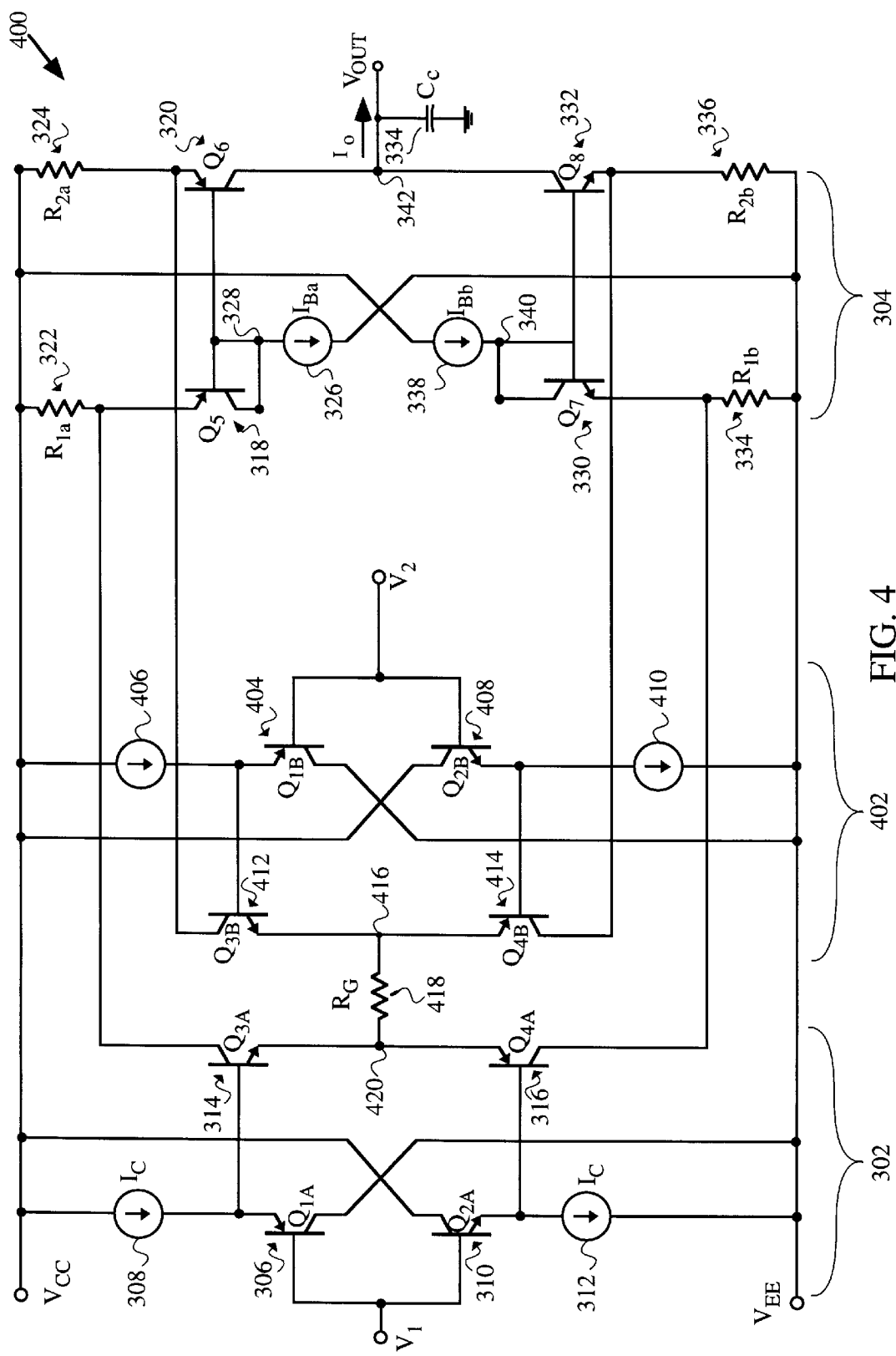
FIG. 4 illustrates a schematic diagram of an amplifier circuit according to a second embodiment of the invention.

FIG. 4 illustrates a schematic diagram of an amplifier circuit 400 according to a second embodiment of the invention. The second embodiment is substantially similar to the first embodiment illustrated in FIG. 3, except that the input stage is a differential diamond follower circuit. The differential diamond follower circuit includes the (first) input diamond follower circuit 302 and a second input diamond follower circuit 402.

The second input diamond follower circuit 402 is connected to the first input diamond follower circuit 302 and the complementary cascode circuit 304. The second input diamond follower circuit 402 includes a transistor ($Q_{1B}$) 404 and a transistor ($Q_{2B}$) 408. The base of the transistor ($Q_{1B}$) 404 receives the input voltage $V_2$, the emitter of the transistor ($Q_{1B}$) 404 is connected to a current source ($I^c$) 406 that is in turn connected to the positive power supply source ($V_{CC}$), and the collector of the transistor ($Q_{1B}$) 404 is coupled to the negative power supply source ($V_{EE}$). The base of the second transistor ($Q_{2B}$) 408 receives the input voltage $V_2$, the collector of the transistor ($Q_{2B}$) 408 is connected to the positive power supply source ($V_{CC}$), and the emitter of the transistor ($Q_{2B}$) 408 is connected to a current source ($I_c$) 410 that is in turn connected to the negative power supply source ($V_{EE}$).

The second input diamond follower 402 also includes a transistor ($Q_{3B}$) 412 and a transistor ($Q_{4B}$) 414. The base of the third transistor 412 is connected to the emitter of the transistor 404, and the base of the transistor 414 is connected to the emitter of the transistor 508. The emitters of the transistor ($Q_{3B}$) 412 and the transistor ($Q_{4B}$) 414 are also commonly connected at a node 416. A resistor ($R_G$) 418 interconnects the first input diamond follower 302 with the second input diamond follower 402. The resister ($R_G$) 418 is coupled a node 420 of the first input diamond follower 302 and the node 416 of the second input diamond follower. The node 420 connects the emitters of the transistors 314 and 316 of the first input diamond follower 302. The first input diamond follower 302 still provides the two (complementary) outputs (first set) to the complementary cascode circuit 304. Additionally, the second input diamond follower 402 provides two (complementary) outputs (second set) to the complementary cascode circuit 304. The first set of outputs from the first input diamond follower 302 connect to the emitters of the transistors ($Q_5$ and $Q_6$) 318 and 330 as previously described, while the second set of outputs from the second diamond follower 402 connect to the emitters of the transistors ($Q_7$ and $Q_8$) 320 and 332. The resistor ($R_G$) 418 serves as the emitter degeneration to the transistors of the input diamond follower circuit 302. Here, the resistor ($R_G$) 418 only conducts that current needed to drive the complementary cascode circuit 304 and therefore can have a small resistance value so that high gains are achievable. In this embodiment, the transistors ($Q_{1B}$ and $Q_{4B}$) 404 and 414 are PNP-type transistors, and the second and third transistor ($Q_{2B}$ and $Q_{3B}$) 408 and 412 are NPN-type transistors.

The amplifier circuit 400 according to a second embodiment of the invention offers the advantages of the amplifier circuit 300 according to the first embodiment. Additionally, however, the amplifier circuit 400 yields a high (e.g., wide) bandwidth and greater input impedance. The high bandwidth results because the second input diamond follower 402 now drives the sixth transistor ($Q_6$) 320 and the eighth transistor ($Q_8$) 332 as common-base devices. The amplifier circuit yields greater input impedance because the input voltage $V_2$ drives the bases of the transistor ($Q_{1B}$) 404 and the transistor ($Q_{2B}$) 408, and thus offers a greater input impedance than available with the first embodiment.

Figure 5:
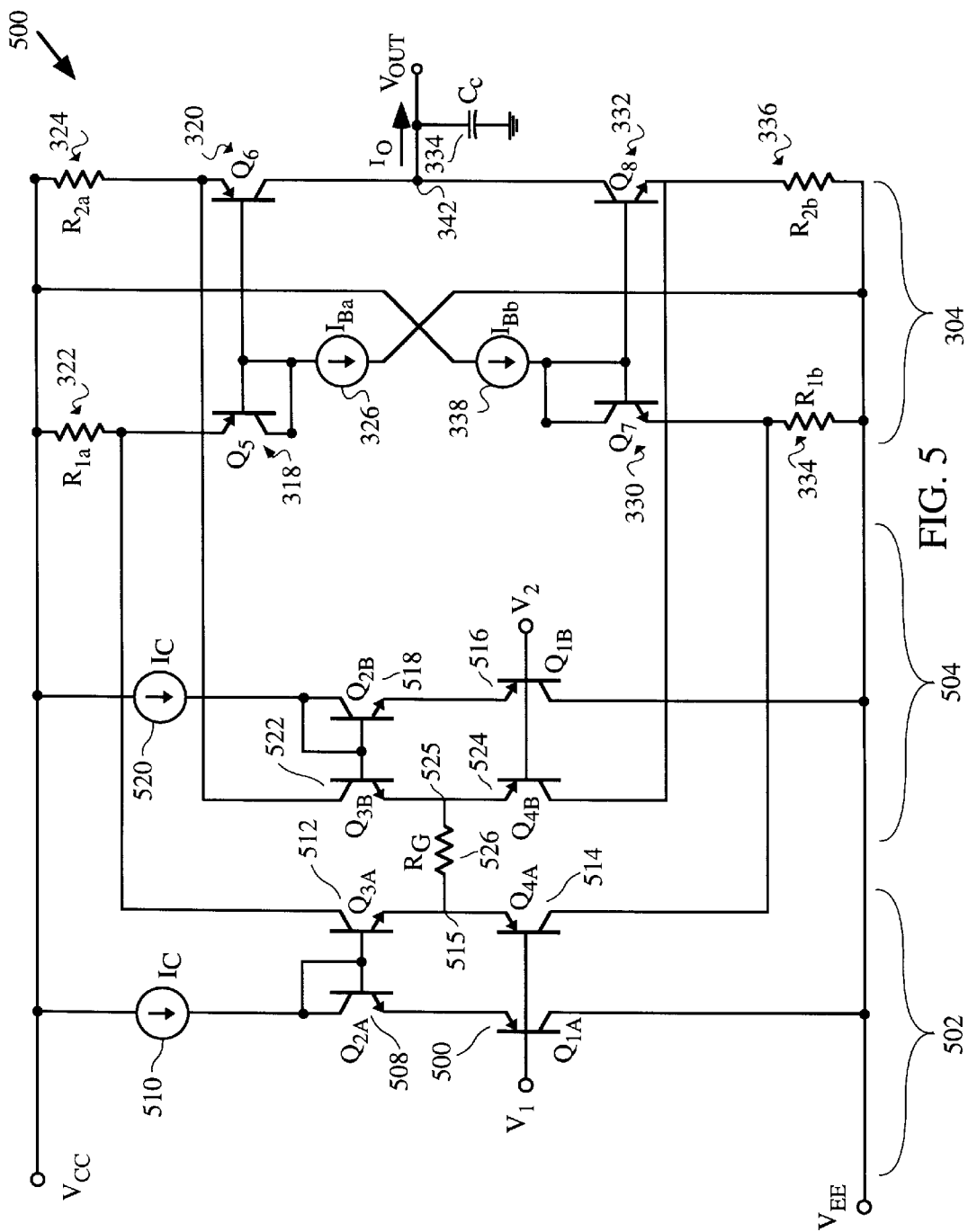
FIG. 5 illustrates a schematic diagram of an amplifier circuit according to a third embodiment of the invention.

FIG. 5 illustrates a schematic diagram of an amplifier circuit 500 according to a third embodiment of the invention. The third embodiment is similar to the second embodiment illustrated in FIG. 4, except that the input stage is a differential class AB circuit. The differential class AB circuit includes a first class AB amplifier 502 and a second class AB amplifier 504.

The first class AB amplifier 502 includes a first transistor ($Q_{1A}$) 506, a second transistor ($Q_{2A}$) 508, a current source 510, a third transistor ($Q_{3A}$) 512, and a fourth transistor ($Q_{4A}$) 514. The base of the first transistor ($Q_{1A}$) 506 receives the input voltage $V_1$ and the collector of the first transistor ($Q_{1A}$) 506 is connected to the negative power supply source ($V_{EE}$). The emitter of the second transistor ($Q_{2A}$) 508 is connected to the emitter of the first transistor ($Q_{1A}$) 506. The collector of the second transistor ($Q_{2A}$) 508 is connected to the current source 510 which in turn connects to the positive power supply source ($V_{CC}$). The base and collector of the second transistor ($Q_{2A}$) 508 are also connected together. The bases of the third transistor ($Q_{3A}$) 512 and the second transistor ($Q_{2A}$) 508 are connected together, and the emitters of the third transistor ($Q_{3A}$) 512 and the fourth transistor ($Q_{4A}$) 514 are connected together at a node 515. The base of the fourth transistor ($Q_{4A}$) 514 receives the input voltage $V_1$. Output from the first class AB amplifier 502 is a first pair of complementary outputs. In particular, a first output current of the first pair of complementary outputs is supplied to the emitter of the transistor 318 of the complementary cascode circuit 304 via the collector of the third transistor ($Q_{3A}$) 512, and a second output current of the first pair of complementary outputs is supplied to the emitter of the transistor 330 of the complementary cascode circuit 304 via the collector of the fourth transistor ($Q_{4A}$) 514. In this embodiment, the first and fourth transistors ($Q_{1A}$ and $Q_{4A}$) 506 and 514 are PNP-type transistors, and the second and third transistor ($Q_{2A}$ and $Q_{3A}$) 508 and 512 are NPN-type transistors.

The second class AB amplifier 504 includes a first transistor ($Q_{1B}$) 516, a second transistor ($Q_{2B}$) 518, a current source 520, a third transistor ($Q_{3B}$) 522, and a fourth transistor ($Q_{4B}$) 524. The base of the first transistor ($Q_{1B}$) 516 receives the input voltage $V_2$ and the collector of the first transistor ($Q_{1B}$) 516 is connected to the negative power supply source ($V_{EE}$). The emitter of the second transistor ($Q_{2B}$) 518 is connected to the emitter of the first transistor ($Q_{1B}$) 516. The collector of the second transistor ($Q_{2B}$) 518 is connected to the current source 520 which in turn connects to the positive power supply source ($V_{CC}$). The base and collector of the second transistor ($Q_{2B}$) 518 are also connected together. The bases of the third transistor ($Q_{3B}$) 522 and the second transistor ($Q_{2B}$) 518 are connected together, and the emitters of the third transistor ($Q_{3B}$) 522 and the fourth transistor ($Q_{4B}$) 524 are connected together at a node 525. The base of the fourth transistor ($Q_{4B}$) 524 receives the input voltage $V_2$. Output from the second class AB amplifier 504 is a second pair of complementary outputs. In particular, a first output current of the second pair of complementary outputs is supplied to the emitter of the transistor 320 of the complementary cascode circuit 304 via the collector of the third transistor ($Q_{3B}$) 522, and a second output current of the second pair of complementary outputs is supplied to the emitter of the transistor 332 of the complementary cascode circuit 304 via the collector of the fourth transistor ($Q_{4B}$) 524. In this embodiment, the first and fourth transistors ($Q_{1B}$ and $Q_{4B}$) 516 and 524 are PNP-type transistors, and the second and third transistor ($Q_{2B}$ and $Q_{3B}$) 518 and 522 are NPN-type transistors.

The advantages of the amplifier circuit 500 according to the third embodiment of the invention are similar to those of the second embodiment, namely high bandwidth, high input impedance, high slew rate, and wide voltage swing. Additionally, with the third embodiment, the voltage swing is further improved such that the negative going voltage swing is essentially to the negative supply potential (i.e., the negative rail). In particular, the negative going voltage swing for the amplifier circuit 500 is down to $V_{EE}+V_{cb}(Q_{4A})+V_{R1b}$, which is approximately equal to $V_{EE}$. As an example, with $V_{CC}$ equal to +3 Volts and $V_{EE}$ equal to −3 Volts, the voltage swing for the amplifier circuit 300 would be approximately from +1.6 to −3.0 Volts. Note in this embodiment of the invention the input voltage swing essentially extends all the way to the negative rail ($V_{EE}$).

Figure 6:
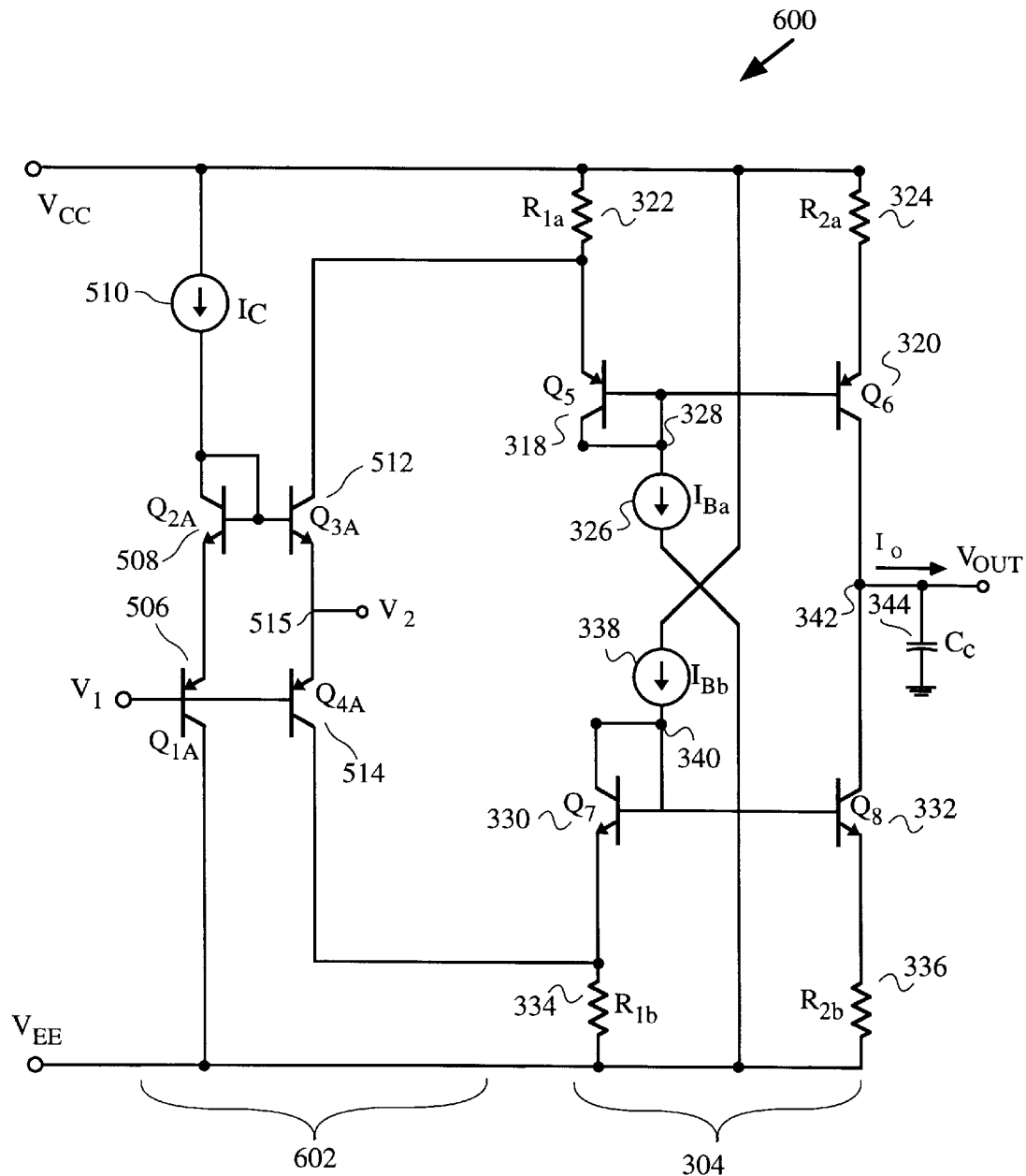
FIG. 6 illustrates a schematic diagram of an amplifier circuit according to a fourth embodiment of the invention.

FIG. 6 illustrates a schematic diagram of an amplifier circuit 600 according to a fourth embodiment of the invention. The amplifier circuit 600 is similar to the amplifier circuit 500 illustrated in FIG. 5, with the exception that the amplifier circuit 600 is a completely folded cascode circuit, whereas the amplifier circuit 500 is only a partially folded cascode circuit. In any event, the amplifier circuit 600 includes an input amplifier stage 602 and the complementary cascode circuit 304. The input amplifier stage 602 corresponds essentially to the first class AB amplifier 502 illustrated in FIG. 5, with the only modification being that the second input voltage $V_2$ is now received at the first node 515 because the second class AB amplifier 504 of the amplifier circuit 500 is not present in the amplifier circuit 600. Despite this difference, the amplifier circuit 600 operates similar to the amplifier circuit 500 though it offers less amplification. The advantages of the fourth embodiment are largely comparable to those of the first embodiment, namely high slew rate and a respectable voltage swing.

In addition, each of the embodiments of the present invention depicted in FIGS. 3–6 can include a feedback network FN, as indicated by the dashed lines, coupled between the output terminal 342 and the second input voltage $V_2$. In certain embodiments, the feedback network FN includes a resistor $R_{fn}$.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An amplifier for amplifying a difference voltage between first and second input voltages to produce an output voltage, said amplifier comprising:

an analog voltage-to-current converter for receiving the first and second input voltages and producing complementary current signals, a complementary mirror output stage coupled to receive the complementary current signals at respective mirror circuits and arranged to generate an output current that is a function of said difference voltage, wherein each of said respective mirror circuits includes a pair of base-coupled transistors having their emitters respectively connected to supply potentials through resistors, and wherein the complementary current signals from said analog voltage-to-current converter are respectively connected to at least one of the emitters of said base-coupled transistors for said respective mirror circuits;

wherein the output voltage is generated by the output current; and an internal feedback network including a resistor Rfn coupling the output voltage to the second input voltage.

2. An amplifier as recited in claim 1, wherein said voltage-to-current converter produces first and second pairs of complementary current signals, and wherein one of the currents for each of the first and second pairs of complementary current signals is connected to the emitter of one of said base-coupled transistors and the other of the currents for each of the first and second pairs of complementary current signals is connected to the emitter of the other of said base-coupled transistors.

3. An amplifier as recited in claim 1, wherein said voltage-to-current converter comprises a diamond follower.

4. An amplifier as recited in claim 1, wherein said voltage-to-current converter comprises a class AB amplifier.

5. An amplifier as recited in claim 1, wherein said amplifier is coupled to a negative supply potential, and wherein said amplifier has an input voltage swing, and the input voltage swing is capable of swing to essentially the negative supply potential.

6. An amplifier for amplifying a difference voltage between first and second input voltages to produce an output voltage, said amplifier comprising:

a first buffer circuit for receiving the first and second input voltages and producing a first set of complementary current signals; and a current amplification circuit for receiving the first set of complementary current signals and generating an output current that is a function of the difference of the first and second input voltages, the output current suitable for generating an output voltage, the output voltage being an amplified version of the difference of the first and second input voltages, said current amplification circuit including complementary circuitry, said complementary circuitry comprising:

a first circuit, connected to said first buffer circuit, including:

a first transistor having a base, an emitter and a collector, the emitter being connected to a first potential through a first resistor, the collector being connected to a second potential through a first bias current source, the base being connected to the collector; and a second transistor having a base, an emitter and a collector, the emitter being connected to the first potential through a second resistor, the collector being connected to an output terminal from which the output voltage is obtained, the base being connected to the base of said first transistor, one of the emitter of the first transistor and the emitter of the second transistor also being connected to receive a first of the first set of complementary current signals;

a second circuit, connected to said first buffer circuit, said second circuit including:

a third transistor having a base, an emitter and a collector, the emitter being connected to the second potential through a third resistor, the collector being connected to the first potential through a second bias current source, the base being connected to the collector; and a fourth transistor having a base, an emitter and a collector, the emitter being connected to the second potential through a fourth resistor, the collector being connected to the output terminal from which the output voltage is obtained, the base being connected to the base of said third transistor, one of the emitter of the third transistor and the emitter of the fourth transistor also being connected to receive a second of the first set of complementary current signals; and an internal feedback network coupled between the output terminal and the second input voltage consisting essentially of a resistor Rfn.

7. An amplifier as recited in claim 6, wherein said first buffer circuit comprises an input diamond follower.

8. An amplifier as recited in claim 6, wherein said first buffer circuit comprises:

a fifth transistor having a base, an emitter and a collector, the emitter connected to the first potential through a third bias current source, the base being connected to receive the first input voltage, and the collector being connected to the second potential;

a sixth transistor having a base, an emitter and a collector, the emitter connected to the second potential through a fourth bias current source, the base being connected to receive the first input voltage, and the collector being connected to the first potential;

a seventh transistor having a base, an emitter and a collector, the emitter connected to receive the second input voltage, the base connected to the emitter of said fifth transistor, and the collector connected to the emitter of the one of said first transistor and said second transistor that is connected to receive the first of the first set of the complementary current signals, for supplying the first of the first set of the complementary current signals thereto; and an eighth transistor having a base, an emitter and a collector, the emitter connected to receive the second input voltage, the base connected to the emitter of said sixth transistor, and the collector connected to the emitter of the one of said third transistor and said fourth transistor that is connected to receive the second of the first set of the complementary current signals, for supplying the second of the first set of the complementary current signals thereto.

9. An amplifier as recited in claim 8, wherein said amplifier further comprises:

a second buffer circuit coupled between said first buffer circuit and said current amplification circuit, said second buffer circuit produces a second set of complementary current signals.

10. An amplifier as recited in claim 9, wherein said second buffer circuit comprises:

a ninth transistor having a base, an emitter and a collector, the emitter connected to the first potential through a fifth current source, the base being connected to receive the second input voltage, and the collector being connected to the second potential;

a tenth transistor having a base, an emitter and a collector, the emitter connected to the second potential through a sixth current source, the base being connected to receive the second input voltage, and the collector being connected to the first potential;

an eleventh transistor having a base, an emitter and a collector, the emitter connected to the commonly connected emitters of said seventh and eighth transistors of said first buffer circuit through a gain resistor, the collector connected to the emitter of said second transistor for supplying a first of the second set of the complementary current signals thereto, and the base connected to the emitter of said ninth transistor; and a twelfth transistor having a base, an emitter and a collector, the emitter connected to the commonly connected emitters of said seventh and eighth transistors of said first buffer circuit through the gain resistor, the collector connected to the emitter of said fourth transistor for supplying a second of the second set of the complementary current signals thereto, and the base connected to the emitter of said tenth transistor.

11. An amplifier as recited in claim 6, wherein said amplifier further comprises a feedback network coupled between the output terminal and the second input voltage.

12. An amplifier as recited in claim 11, wherein said feedback network comprises a resister.

13. An amplifier as recited in claim 6, wherein said first buffer circuit comprises a class AB amplifier.

14. An amplifier as recited in claim 6, wherein said first buffer circuit comprises:

a fifth transistor having a base, an emitter and a collector, the collector connected to the first potential through a third bias current source, and the base and the collector being connected together;

a sixth transistor having a base, an emitter and a collector, the base connected to the first input voltage, the emitter being connected to the emitter of said fifth transistor, and the collector being connected to the second potential;

a seventh transistor having a base, an emitter and a collector, the emitter connected to receive the second input voltage, the base connected to the base of said fifth transistor, and the collector connected to the emitter of the one of said first transistor and said second transistor that is connected to receive the first of the first set of the complementary current signals, for supplying the first of the first set of the complementary current signals thereto; and an eighth transistor having a base, an emitter and a collector, the emitter connected to receive the second input voltage, the base connected to the first input voltage, and the collector connected to the emitter of the one of said third transistor and said fourth transistor that is connected to receive the second of the first set of the complementary current signals, for supplying the second of the first set of the complementary current signals thereto.

15. An amplifier as recited in claim 6, wherein said amplifier further comprises:
   a second buffer circuit coupled between said first buffer circuit and said current amplification circuit, said second buffer circuit produces a second set of complementary current signals.

16. An amplifier as recited in claim 15,
   wherein said first buffer circuit comprises:
      a fifth transistor having a base, an emitter and a collector, the emitter connected to the first potential through a third bias current source, the base being connected to receive the first input voltage, and the collector being connected to the second potential;
      a sixth transistor having a base, an emitter and a collector, the emitter connected to the second potential through a fourth bias current source, the base being connected to receive the first input voltage, and the collector being connected to the first potential;
      a seventh transistor having a base, an emitter and a collector, the emitter connected to a first node, the base connected to the emitter of said fifth transistor, and the collector connected to the emitter of said first transistor for supplying the first of the first set of the complementary current signals thereto; and
      an eighth transistor having a base, an emitter and a collector, the emitter connected to the first node, the base connected to the emitter of said sixth transistor, and the collector connected to the emitter of said third transistor for supplying the second of the first set of the complementary current signals thereto, and
   wherein said second buffer circuit comprises:
      a ninth transistor having a base, an emitter and a collector, the emitter connected to the first potential through a fifth current source, the base being connected to receive the second input voltage, and the collector being connected to the second potential;
      a tenth transistor having a base, an emitter and a collector, the emitter connected to the second potential through a sixth current source, the base being connected to receive the second input voltage, and the collector being connected to the first potential;
      an eleventh transistor having a base, an emitter and a collector, the emitter connected to a second node, the collector connected to the emitter of said second transistor for supplying a first of the second set of the complementary current signals thereto, and the base connected to the emitter of said ninth transistor; and
      a twelfth transistor having a base, an emitter and a collector, the emitter connected to the second node, the collector connected to the emitter of said fourth transistor for supplying a second of the second set of the complementary current signals thereto, and the base connected to the emitter of said tenth transistor.

17. An amplifier as recited in claim 16, wherein said amplifier further comprises a gain resistor connected between the first node of said first buffer circuit and the second node of said second buffer circuit.

18. An amplifier as recited in claim 15,
   wherein said first buffer circuit comprises:
      a fifth transistor having a base, an emitter and a collector, the collector connected to the first potential through a third bias current source, and the base and the collector being connected together;
      a sixth transistor having a base, an emitter and a collector, the base connected to the first input voltage, the emitter being connected to the emitter of said fifth transistor, and the collector being connected to the second potential;
      a seventh transistor having a base, an emitter and a collector, the emitter connected to a first node, the base connected to receive the base of said fifth transistor, and the collector connected to the emitter of said first transistor for supplying the first of the first set of the complementary current signals thereto; and
      an eighth transistor having a base, an emitter and a collector, the emitter connected to the first node, the base connected to receive the first input voltage, and the collector connected to the emitter of said third transistor for supplying the second of the first set of the complementary current signals thereto,
   wherein said second buffer circuit comprises:
      a ninth transistor having a base, an emitter and a collector, the collector connected to the first potential through a fourth bias current source, and the base and the collector being connected together;
      a tenth transistor having a base, an emitter and a collector, the base connected to the second input voltage, the emitter being connected to the emitter of said ninth transistor, and the collector being connected to the second potential;
      an eleventh transistor having a base, an emitter and a collector, the emitter connected to a second node, the collector connected to the emitter of said second transistor for supplying a first of the second set of the complementary current signals thereto, and the base connected to the base of said ninth transistor; and
      a twelfth transistor having a base, an emitter and a collector, the emitter connected to the second node, the collector connected to the emitter of said fourth transistor for supplying a second of the second set of the complementary current signals thereto, and the base connected to the second input voltage, and
   wherein said amplifier further comprises a gain resistor connected between the first node of said first buffer circuit and the second node of said second buffer circuit.

19. An amplifier for amplifying a difference voltage between first and second input voltages to produce an output voltage that is a function of said difference voltage, said amplifier comprising:
   a first buffer circuit for receiving first and second input voltages and producing a first set of complementary current signals; and
   a current amplification circuit for receiving the first set of complementary current signals and outputting an output current, the output current being a function of the difference of the first and second input voltages, the output current suitable for generating an output voltage, the output voltage being an amplified version of the difference of the first and second input voltages, said current amplification circuit including complementary circuitry, said complementary circuitry comprising:
      a first circuit including:
         a first transistor having a base, an emitter and a collector, the emitter being connected to a first potential through a first resistor, the collector being connected to a second potential through a first bias current source, the base being connected to the collector, the emitter also being connected to receive a first of the first set of complementary current signal; and a second transistor having a base, an emitter and a collector, the emitter being connected to the first potential through a second resistor, the collector being connected to an output terminal from which the output voltage is obtained, the base being connected to the base of said first transistor;

a second circuit including:

a third transistor having a base, an emitter and a collector, the emitter being connected to the second potential through a third resistor, the collector being connected to the first potential through a second bias current source, the base being connected to the collector, the emitter also being connected to receive a second of the first set of complementary current signals; and a fourth transistor having a base, an emitter and a collector, the emitter being connected to the second potential through a fourth resistor, the collector being connected to the output terminal from which the output voltage is obtained, the base being connected to the base of said third transistor; and an internal feedback network coupling the output voltage and the second input voltage consisting essentially of a resistor.

20. An amplifier as recited in claim 19, wherein said first buffer circuit comprises:

a fifth transistor having a base, an emitter and a collector, the emitter connected to the first potential through a third bias current source, the base being connected to receive the first input voltage, and the collector being connected to the second potential;

a sixth transistor having a base, an emitter and a collector, the emitter connected to the second potential through a fourth bias current source, the base being connected to receive the first input voltage, and the collector being connected to the first potential;

a seventh transistor having a base, an emitter and a collector, the emitter connected to receive the second input voltage, the base connected to the emitter of said fifth transistor, and the collector connected to the emitter of said first transistor for supplying the first of the first set of the complementary current signals thereto; and an eighth transistor having a base, an emitter and a collector, the emitter connected to receive the second input voltage, the base connected to the emitter of said sixth transistor, and the collector connected to the emitter of said third transistor for supplying the second of the first set of the complementary current signals thereto.

21. An amplifier as recited in claim 19, wherein said first buffer circuit comprises:

a fifth transistor having a base, an emitter and a collector, the collector connected to the first potential through a third bias current source, and the base and the emitter being connected together;

a sixth transistor having a base, an emitter and a collector, the base connected to the first input voltage, the emitter being connected to the emitter of said fifth transistor, and the collector being connected to the second potential;

a seventh transistor having a base, an emitter and a collector, the emitter connected to receive the second input voltage, the base connected to the base of said fifth transistor, and the collector connected to the emitter of said first transistor for supplying the first of the first set of the complementary current signals thereto; and an eighth transistor having a base, an emitter and a collector, the emitter connected to receive the second input voltage, the base connected to the first input voltage, and the collector connected to the emitter of said third transistor for supplying the second of the first set of complementary current signals thereto.

* * * * *